United States Patent
Fang et al.

(10) Patent No.: US 12,328,899 B2
(45) Date of Patent: Jun. 10, 2025

(54) SEMICONDUCTOR DEVICE AND METHOD FOR MANUFACTURING SEMICONDUCTOR DEVICE

(71) Applicant: CSMC TECHNOLOGIES FAB2 CO., LTD., Wuxi (CN)

(72) Inventors: Dong Fang, Wuxi (CN); Zheng Bian, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 353 days.

(21) Appl. No.: 17/281,351

(22) PCT Filed: Oct. 30, 2019

(86) PCT No.: PCT/CN2019/114244
§ 371 (c)(1),
(2) Date: Mar. 30, 2021

(87) PCT Pub. No.: WO2020/103655
PCT Pub. Date: May 28, 2020

(65) Prior Publication Data
US 2022/0045207 A1    Feb. 10, 2022

(30) Foreign Application Priority Data

Nov. 19, 2018  (CN) .......................... 201811378845.9

(51) Int. Cl.
*H10D 30/66*    (2025.01)
*H10D 30/01*    (2025.01)
*H10D 64/00*    (2025.01)

(52) U.S. Cl.
CPC ....... *H10D 30/668* (2025.01); *H10D 30/0297* (2025.01); *H10D 64/117* (2025.01)

(58) Field of Classification Search
CPC ........... H01L 29/7813; H01L 29/66734; H01L 29/407; H01L 29/42376; H01L 29/41766;
(Continued)

(56) References Cited

U.S. PATENT DOCUMENTS

| | | | |
|---|---|---|---|
| 2010/0123187 A1* | 5/2010 | Burke | .................... H01L 29/407 257/330 |
| 2013/0168760 A1* | 7/2013 | Hsieh | ................ H01L 29/42376 438/270 |

(Continued)

FOREIGN PATENT DOCUMENTS

| | | |
|---|---|---|
| CN | 103151382 | 6/2013 |
| CN | 106057674 | 10/2016 |

(Continued)

OTHER PUBLICATIONS

International Search Report (w/ English translation) for corresponding International Application No. PCT/CN2019/114244, mailed on Jan. 7, 2020, 4 pages.

(Continued)

*Primary Examiner* — Samuel A Gebremariam
*Assistant Examiner* — Jonas T Beardsley
(74) *Attorney, Agent, or Firm* — Dority & Manning, P.A.

(57) ABSTRACT

The present application relates to a semiconductor device, comprising a substrate, with a body region being formed on the substrate, and a well region being formed in the body region; and further comprising trenches penetrating through the well region and the body region and extending to the substrate, wherein a first polysilicon body and a second polysilicon body, which are isolated from each other, are respectively formed at the bottom and the top of each trench to form a split gate structure, the trenches are filled with an inter-layer dielectric layer, a conductive plug penetrating through the inter-layer dielectric layer and extending into the (Continued)

first polysilicon body is formed in each trench, the conductive plug is isolated from the second polysilicon body by means of the inter-layer dielectric layer, the conductive plug is connected to a source electrode, and the second polysilicon body is connected to a gate electrode.

11 Claims, 10 Drawing Sheets

(58) Field of Classification Search
CPC .............. H10D 30/668; H10D 30/0297; H10D 64/513; H10D 64/117; H10D 64/518
See application file for complete search history.

(56) References Cited

U.S. PATENT DOCUMENTS

2015/0048445 A1* 2/2015 Noebauer ......... H01L 29/66333
438/270
2015/0311295 A1 10/2015 Lee et al.
2015/0349091 A1* 12/2015 Yilmaz ............. H01L 29/66666
438/270
2018/0323155 A1 11/2018 Wang et al.

FOREIGN PATENT DOCUMENTS

| CN | 106876279 | 6/2017 |
| CN | 107068763 | 8/2017 |

OTHER PUBLICATIONS

Chinese Office Action for corresponding CN Application No. 201811378845.9, dated Oct. 27, 2020, 7 pages.

Supplementary European Search Report for corresponding International Application No. EP 19888173, mailed on Jul. 21, 2022, 11 pages.

* cited by examiner

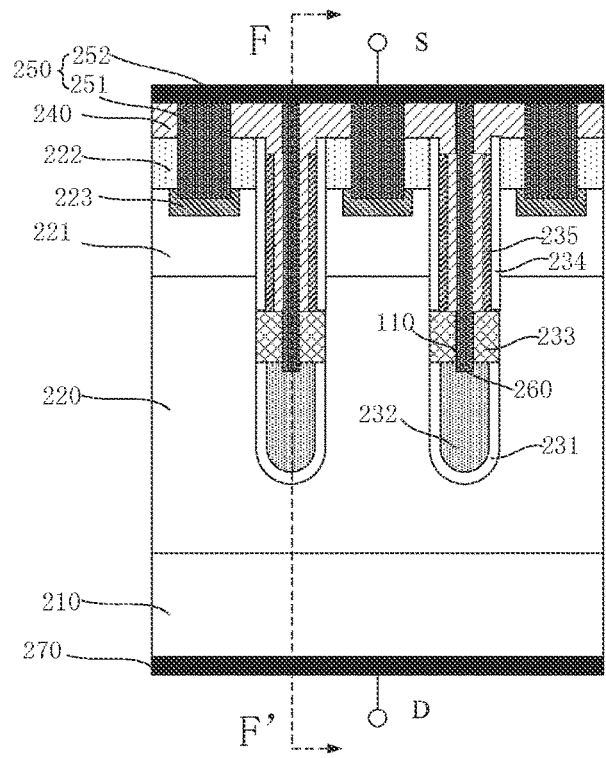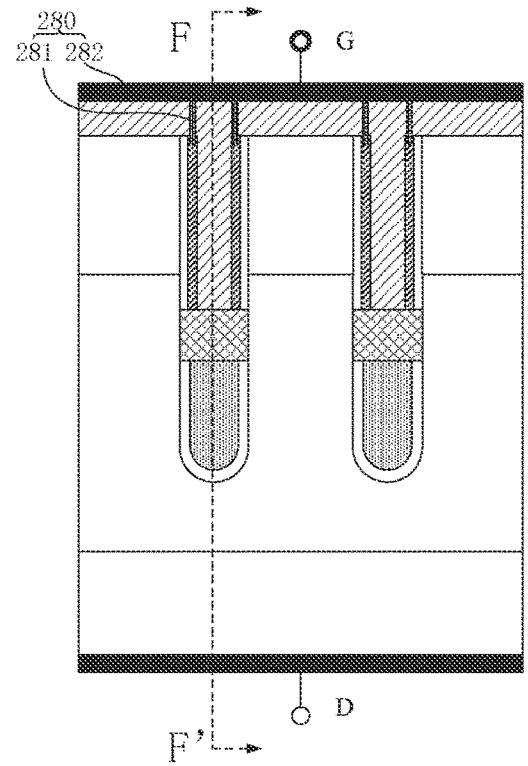
FIG. 5a  FIG. 5b
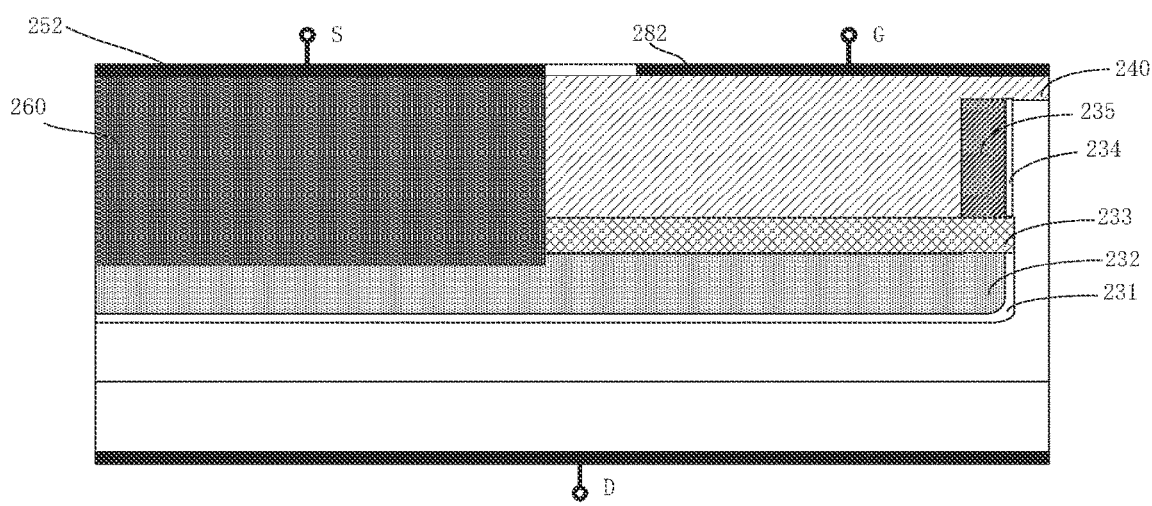
FIG. 5c

SEMICONDUCTOR DEVICE AND METHOD FOR MANUFACTURING SEMICONDUCTOR DEVICE

CROSS REFERENCE TO RELATED APPLICATION

This application claims the benefits of the priority of Chinese patent application No. 201811378845.9, titled "SEMICONDUCTOR DEVICE AND METHOD FOR MANUFACTURING SEMICONDUCTOR DEVICE", filed before China National Intellectual Property Administration on Nov. 19, 2018, and the content thereof is incorporated in its entirety herein by reference for all purposes.

TECHNICAL FIELD

The present disclosure relates to the field of semiconductor technology, and particularly to a semiconductor device and a method of manufacturing a semiconductor device.

BACKGROUND

Trench vertical double diffusion metal oxide semiconductor (VDMOS) field effect transistors adopt generally a split-gate structure in order to decrease the gate-drain parasitic capacitance. The split-gate structure contains gate polysilicon and split polysilicon, which are isolated from each other, wherein the split polysilicon proximate to the drain is connected to the source, and the gate polysilicon located on the split polysilicon is connected to the gate. To achieve the connection of the split polysilicon and the source, the split polysilicon is generally led out from the peripheral region of the cell in which the split-gate is located, so that the split polysilicon is connected to the source in the peripheral region of the split-gate. However, on the one hand, in order to lead the split polysilicon out of the split-gate cell, it is required to etch the split polysilicon in the manufacturing process, thereby resulting in cavities caused by etching on the surface of the split polysilicon. On the other hand, leading out the split polysilicon out of the split-gate region can also result in the increase of the area of the device.

SUMMARY

According to various embodiments of the present disclosure, a semiconductor device and a method of manufacturing the semiconductor device are provided.

A semiconductor device is provided, including:
a semiconductor substrate having a first conductivity type;
a body region having a second conductivity type and formed on an upper surface layer of the substrate;
a well region having the first conductivity type and formed on a surface layer of the body region having the second conductivity;
a split-gate structure provided with a trench passing through the well region and the body region and extending to the substrate, the split-gate structure including:
a first polysilicon body formed at a bottom of the trench, and a first oxide layer being formed between the first polysilicon body, and a bottom wall and a side wall of the trench;
a second polysilicon body formed on a top side wall of the trench and not full filling the trench, and a second oxide layer being formed between the second polysilicon body and the side wall of the trench; and
an isolation structure formed between the first polysilicon body and the second polysilicon body to isolate the first polysilicon body from the second polysilicon body;
an interlayer dielectric layer formed on a surface of the well region and a surface of the split-gate structure and filled into the trench;
a source passing through the interlayer dielectric layer and the well region and extending to the body region;
a conductive plug passing through the interlayer dielectric layer and the isolation structure in the trench and extending into the first polysilicon body, the conductive plug being connected to the source, the second polysilicon body and the conductive plug being isolated from each other by the interlayer dielectric layer;
a gate passing through the interlayer dielectric layer and connected to the second polysilicon body; and
a drain formed on a lower surface of the substrate having the first conductivity type.

A method of manufacturing a semiconductor device is provided, including:
providing a semiconductor substrate, and the substrate having a first conductivity type;
forming a split-gate structure on the substrate, including:
providing a trench on the substrate;
forming a first oxide layer on a side wall of the trench;
forming a first polysilicon body at a bottom of the trench;
etching off the first oxide layer located above the first polysilicon body;
forming an isolation structure on the first polysilicon body and the first oxide layer;
forming a second oxide layer on the side wall of the trench located above the isolation structure;
forming a second polysilicon body on the second oxide layer and the isolation structure, the second polysilicon body not full filling the trench; and
etching the second polysilicon body to remove the second polysilicon body at the bottom of the trench and retain the second polysilicon body on the side wall of the trench;
doping an upper surface layer of the substrate to form a body region in contact with the second oxide layer, and the body region having a second conductivity type;
doping the body region to form a well region in contact with the second oxide layer, the well region having a first conductivity type;
forming an interlayer dielectric layer on a surface of the well region and a surface of the split-gate structure, the interlayer dielectric layer being filled into the trench;
forming a conductive plug, the conductive plug passing through the interlayer dielectric layer and the isolation structure in the trench, and extending into the first polysilicon body, the conductive plug and the second polysilicon body being isolated from each other by the interlayer dielectric layer; and
leading out a source, a gate, and a drain, the source passing through the well region and extending to the body region, the source being connected to the conductive plug, the gate passing through the interlayer dielectric layer and being connected to the second polysilicon body, the drain being formed on a lower surface of the substrate.

One or more embodiments of the present disclosure will be described in detail in the following figures and description. Other features, objects and advantages of this application will become more apparent from the description, drawings and claims.

BRIEF DESCRIPTION OF THE DRAWINGS

In order to better describe and illustrate the embodiments and/or examples of the inventions disclosed herein, one or more figures can be referred to. The additional details or examples for illustrating the drawings should not be deemed as limiting the scope of any one of the disclosed inventions, the currently described embodiments and/or examples, and the best mode of the inventions currently understood.

FIG. 5a is a sectional view of the semiconductor device according to an embodiment taken along D-D' section in FIG. 4;

FIG. 5b is a sectional view of the semiconductor device according to an embodiment taken along E-E' section in FIG. 4;

FIG. 5c is a sectional view of the semiconductor device according to an embodiment taken along F-F' section in FIG. 4;

DETAILED DESCRIPTION OF THE EMBODIMENTS

Figure 1:
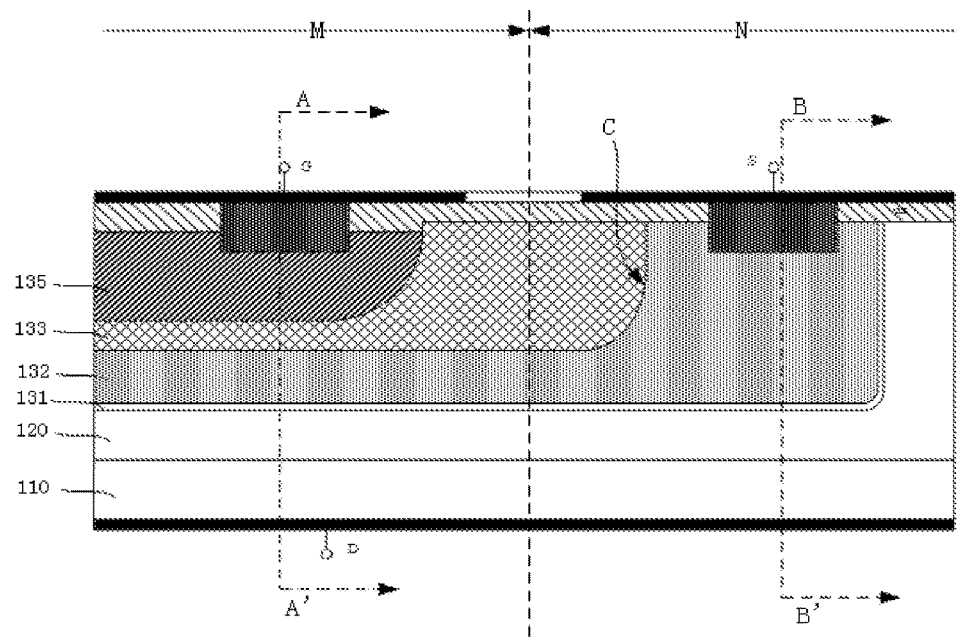
FIG. 1 is a sectional view of a semiconductor device in the conventional technology.
Figure 2A:
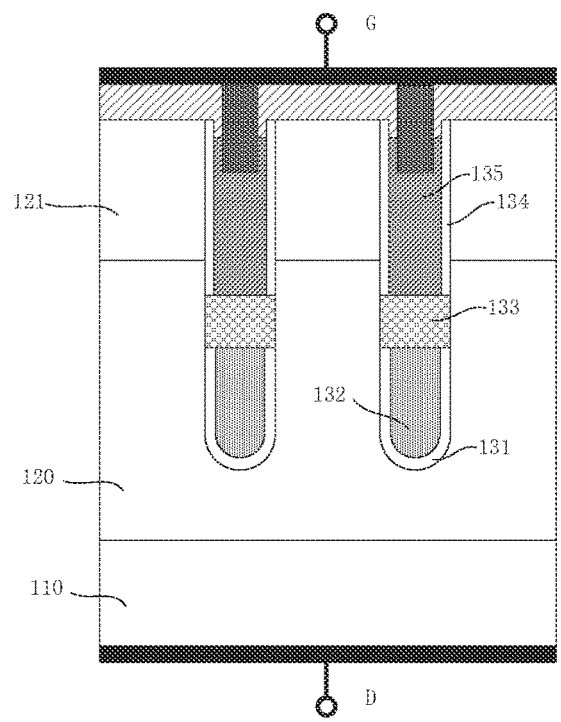
FIG. 2a is a sectional view of the semiconductor device of FIG. 1 taken along A-A' section.
Figure 2B:
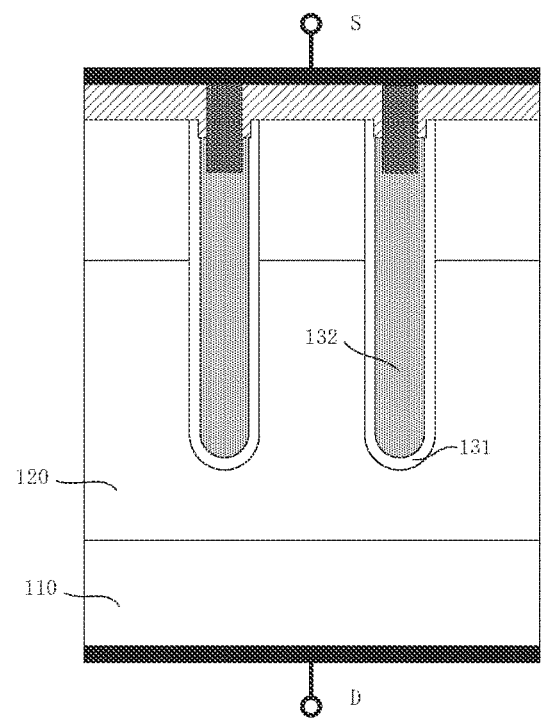
FIG. 2b is a sectional view of the semiconductor device of FIG. 1 taken along B-B' section.

FIG. 1 is a longitudinal sectional view illustrating a semiconductor device according to the conventional technology. FIG. 2a is a sectional view corresponding to the section along A-A' in FIG. 1. FIG. 2b is a sectional view corresponding to the section along B-B' in FIG. 1. The semiconductor device according to the conventional technology includes a base 110, an epitaxial layer 120, a body region 121, a source region (not shown), and a split-gate structure. The split-gate structure is provided with a trench. The split-gate structure includes a split polysilicon 132 and a gate polysilicon 135, which are formed in the trench, an oxide layer 131 formed between the split polysilicon 132 and a side wall of the trench, and a gate oxide layer 134 formed between the gate polysilicon 135 and the side wall of the trench. The gate polysilicon 135 is connected to a gate G. The split polysilicon 132 is connected to a source S. In the semiconductor device according to the conventional technology, the split-gate is located in a cell region M. A lead-out region of the split polysilicon 132 is a peripheral region N with respect to the cell region M. The split polysilicon 132 in the peripheral region N is led out to be connected to the source S. That is, the conventional semiconductor device further contains the peripheral region N dedicated to lead out the split polysilicon 132, thereby increasing the area of the semiconductor device. Moreover, in the conventional technology, in order to lead out the split polysilicon 132 in the peripheral region N, it is required to etch the split polysilicon 132 in the implementation process, so as to remove a portion of the split polysilicon in the cell region M and retain the split polysilicon in the peripheral region N. Therefore, it is prone to forming cavities at a side wall C of the split polysilicon 132, which affects the performance of the device.

Figure 3:
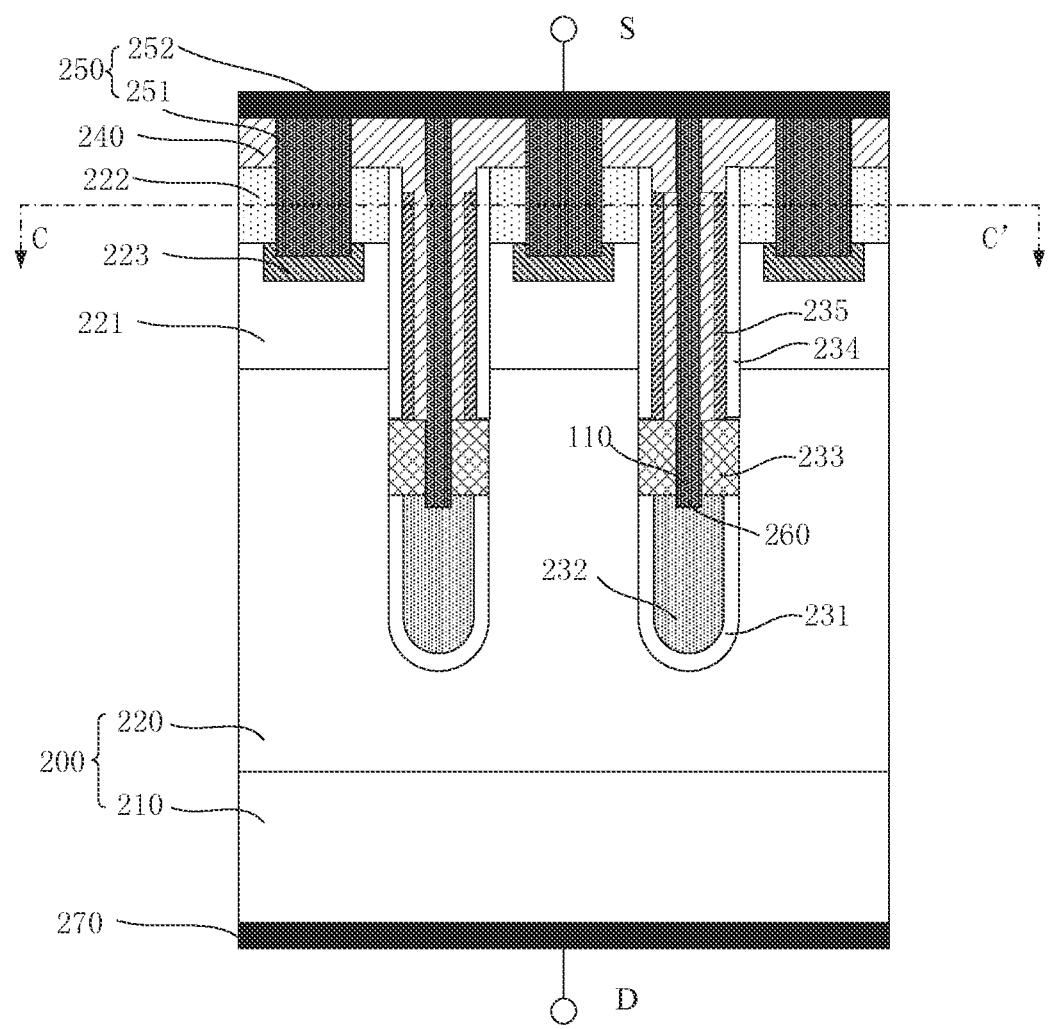
FIG. 3 is a schematic view of a semiconductor device according to an embodiment of the present disclosure.

FIG. 3 shows a semiconductor device according to an embodiment of the present disclosure. The semiconductor device includes: a semiconductor substrate 200 having a first conductivity type, a body region 221 formed on an upper surface layer of the substrate 200 and having a second conductivity type, and a well region 222 formed on an upper surface layer of the body region 221 and having the first conductivity type.

The well region 222 is provided with a trench. The trench passes through the well region 222 and the body region 221, and extends into the substrate 200, that is, the bottom end of the trench is located in the substrate 200. A first polysilicon body 232 is formed at the bottom of the trench. A first oxide layer 231 is formed between the first polysilicon body 232 and a bottom wall of the trench and between the first polysilicon body 232 and a side wall of the trench. That is, the first oxide layer 231 is disposed between the first polysilicon body 232 and the substrate 200. A second polysilicon body 235 is formed on a top side wall of the trench. A second oxide layer 234 is formed between the second polysilicon body 235 and the side wall of the trench, and the second polysilicon body 235 does not full fill the trench. The second polysilicon body 235 has a hollow inner cavity. An isolation structure 233 is formed between the first polysilicon body 232 and the second polysilicon body 235. The first polysilicon body 232 and the second polysilicon body 235 are isolated from each other by the isolation structure 233. The trench, the polysilicon body in the trench, the isolation structure, and the oxide layer form the split-gate structure. Moreover, by providing the isolation structure 233, it is advantageous to flexibly adjust the distance between the first polysilicon body 232 and the second polysilicon body 235. An interlayer dielectric layer 240 is formed on a surface of the well region 222 and a surface of the split-gate structure, and the interlayer dielectric layer 240 is also filled into a region between the second polysilicon bodies 235 at two sides of the trench. A conductive plug 260 is formed in the interlayer dielectric layer 240 above the trench. The conductive plug 260 passes through the interlayer dielectric layer 240 and the isolation structure 233 and extends into the first polysilicon body 232. The conductive plug 260 is isolated from the second polysilicon body 235 by the interlayer dielectric layer 240, that is, the conductive plug 260 passes through the interlayer dielectric layer between the second polysilicon bodies 235 at the two sides of the trench, and extends downward into the first polysilicon body 232.

The semiconductor device further contains a source 250, a gate (not shown in FIG. 3), and a drain 270. The source 250 passes through the interlayer dielectric layer 240 and the well region 222 and extends into the body region 221. The conductive plug 260 is connected to the source. The gate passes through the interlayer dielectric layer 240 and is connected to the second polysilicon body 235. The drain 270 is formed on a lower surface of the substrate 200.

The above-mentioned semiconductor device includes a split-gate structure. The split-gate includes a first polysilicon body and a second polysilicon body which are isolated from each other. The first polysilicon body is connected to the gate. When a voltage is applied to the gate, an inversion layer is formed in the body regions at two sides of the trench through the second polysilicon body and the second oxide layer, thereby forming a conductive channel to make the source-drain turned on. Moreover, the first polysilicon body is connected to the source, which can reduce the capacitance of the gate-drain. In this embodiment, the conductive plug is formed inside the trench. One end of the conductive plug is connected to the source. The other end of the conductive plug sequentially passes through the interlayer dielectric layer and the isolation structure, and is inserted into the first polysilicon body, that is, an electrode of the first polysilicon is led out through the conductive plug, so that the first polysilicon is connected to the source, thereby achieving a shielding effect of the first polysilicon body on the gate-drain parasitic capacitance. In this embodiment, since the electrode of the first polysilicon body is led out through the conductive plug in the trench, it is not required to etch the first polysilicon body to form a side wall, which can avoid the cavities formed in the side wall of the first polysilicon body due to the lithography. In addition, the electrode of the first polysilicon is directly led out in the split-gate cell, which can reduce the area of the device.

In an embodiment, the second polysilicon body 235 is isolated from the first polysilicon body 232. At least a portion of the second polysilicon body 235 is located directly above the first polysilicon body 232 to cover a portion of the top surface of the first polysilicon body 232. That is, the second polysilicon body 235 and the first polysilicon body 232 have an overlapping portion in the width direction of the trench, so that the first polysilicon body 232 can have a better shielding effect on the gate-drain capacitance.

In an embodiment, the first conductivity type can be N-type, and the second conductivity type can be P-type. In another embodiment, the second conductivity type can be P-type, and the first conductivity type can be N-type.

In an embodiment, as shown in FIG. 3, the semiconductor substrate 200 includes a semiconductor base 210 and an epitaxial layer 220 formed by epitaxial growth from the semiconductor base. The body region 221 is specifically formed on an upper surface layer of the epitaxial layer 220. The trench passes through the well region 222 and the body region 221 and extends into the substrate 200. Specifically, the trench passes though the well region 222 and the body region 221 and extends into the epitaxial layer 220, namely, the bottom end of the trench is located in the epitaxial layer 220.

In an embodiment, as shown in FIG. 3, the source 250 includes a source lead-out structure 251 and a source metal layer 252. The source metal layer 252 covers the interlayer dielectric layer 240. One end of the source lead-out structure 251 passes through the interlayer dielectric layer 240 and the well region 222, and is inserted into the body region 221. The other end thereof is connected to the source metal layer 252. One end of the conductive plug 260 is inserted into the first polysilicon body 232, and the other end thereof is also connected to the source metal layer 252.

In an embodiment, the first oxide layer 231 is a first silicon oxide layer, and the second oxide layer 234 is a second silicon oxide layer. In an embodiment, the isolation structure 233 is a third oxide layer, and the third oxide layer can be a third silicon oxide layer. In an embodiment, the interlayer dielectric layer 240 is a fourth oxide layer, and the fourth oxide layer can be a fourth silicon oxide layer.

In an embodiment, as shown in FIG. 3, a heavily doped region 223 is formed in the body region 221. The heavily doped region 223 has the second conductivity type. The doping concentration of the heavily doped region 223 is higher than the doping concentration of the body region 221. The source 250 extends into the heavily doped region 223. Specifically, one end of the source lead-out structure 251 can extend into the heavily doped region 223, that is, the one end of the source lead-out structure 251 is surrounded by the heavily doped region 223, and the other end is connected to the source metal layer 252. The heavily doped region having a comparably high concentration is connected with the source lead-out structure, so that the source and the body region form a better ohmic contact, thereby reducing the on-state resistance.

Figure 4:
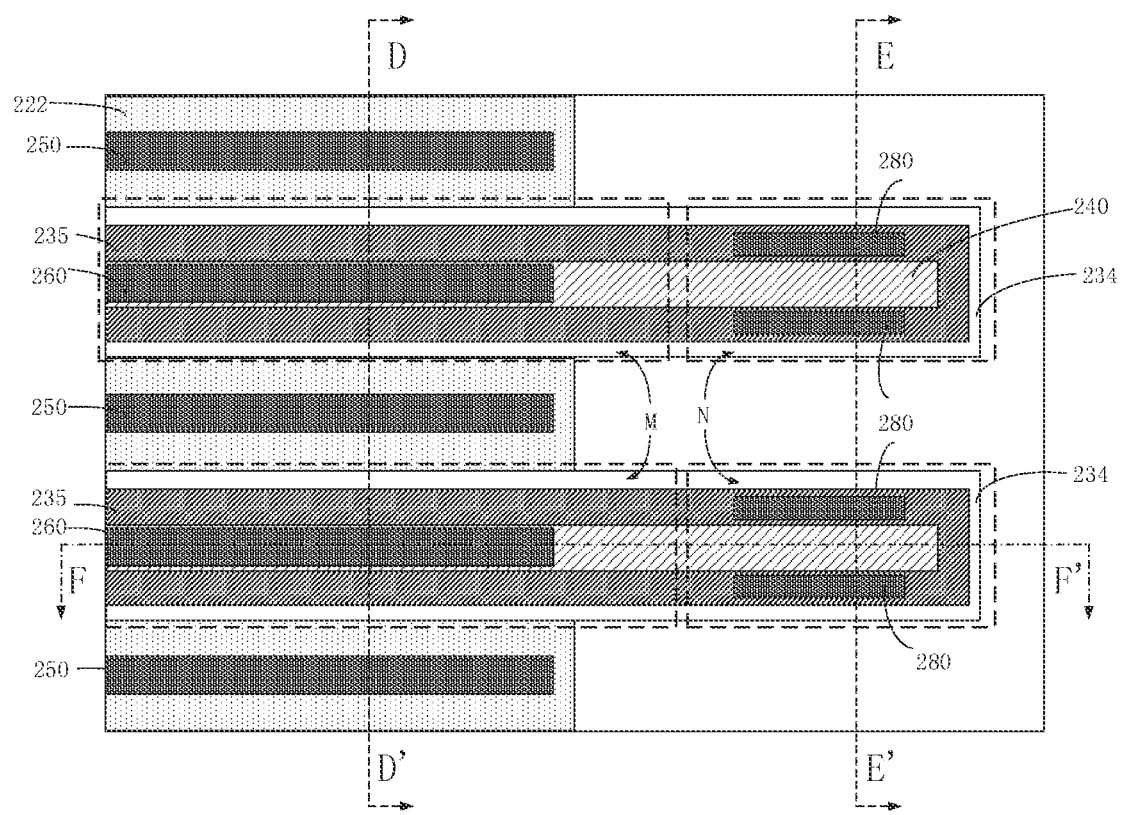
FIG. 4 is a sectional view of a semiconductor device according to an embodiment taken along C-C' section in FIG. 3.

FIG. 4 is a sectional view of the semiconductor device according to an embodiment taken along lateral section C-C' in FIG. 3. The trench includes a first trench region M located at one side and a second trench region N located at the other side. The first polysilicon body 232 (not shown in FIG. 4) leads out the conductive plug 260 from the first trench region M. The second polysilicon body 235 leads out the gate 280 from the second trench region N, that is, the gate 280 and the conductive plug 260 are spaced from each other in the trench. The source 250 is led out from the body region 222, and the source 250 is located at a side of the conductive plug 260. Referring to FIGS. 5a and 5b, FIG. 5a is a sectional view of the semiconductor device along a longitudinal section D-D' in FIG. 4, that is, FIG. 5a shows a structure of the semiconductor device corresponding to the source and the lead-out region of the conductive plug. FIG. 5b is a sectional view of the semiconductor device along a longitudinal section E-E', that is, FIG. 5b shows a structure of the semiconductor device corresponding to a gate lead-out region. The source 250 includes the source metal layer 252 and the source lead-out structure 251. The gate 280 includes a gate metal layer 282 and a gate lead-out structure 281. One end of the gate lead-out structure 281 is connected to the gate metal layer 282, and the other end thereof passes through the interlayer dielectric layer 240 and is connected to the second polysilicon body 235. In an embodiment, specifically, the source lead-out structure 251 and the conductive plug 260 are disposed at the same side. The gate lead-out structure 281 is disposed at the other side. The gate lead-out structure 281 and the conductive plug 260 are spaced from each other, thereby avoiding the parasitic capacitance due to the short distance between the electrodes. FIG. 5c is a sectional view of the semiconductor device along a longitudinal section F-F' in FIG. 4. FIG. 5c is also the sectional view of the semiconductor device along a longitudinal section F-F' in FIG. 5a and the sectional view of the semiconductor device along a longitudinal section F-F' in FIG. 5b. The gate lead-out structure and the conductive plug 260 are spaced from each other, which is also advantageous to space the source metal layer 252 from the gate metal layer 282. The source metal layer 252 is disposed at the same side as the source lead-out structure and the conductive plug 260, thereby facilitating the connection with the source lead-out structure and the conductive plug 260. The gate metal layer 282 is disposed at the same side as the gate lead-out structure, thereby facilitating the connection with the gate lead-out structure.

In an embodiment, as shown in FIG. 4, the second polysilicon body 235 in the second trench region N is formed on the side wall of the trench, and does not full fill the trench in the second trench region N, that is, the second trench region N also includes the interlayer dielectric layer 240, and the interlayer dielectric layer 240 is filled into the trench. The second polysilicon body 235 surrounds the interlayer dielectric layer 240. The gate is led out from the second polysilicon bodies 235 at the two sides of the interlayer dielectric layer 240 in the second trench region N. In an embodiment, a width of the trench in the first trench region M is identical to a width of the trench in the second trench region. The second polysilicon bodies 235 having the same thickness are formed on the side walls of the trench at the two sides of the conductive plug 260, and the gate 280 is led out from the second polysilicon bodies 235 at the two sides of the conductive plug 260.

Figure 6:
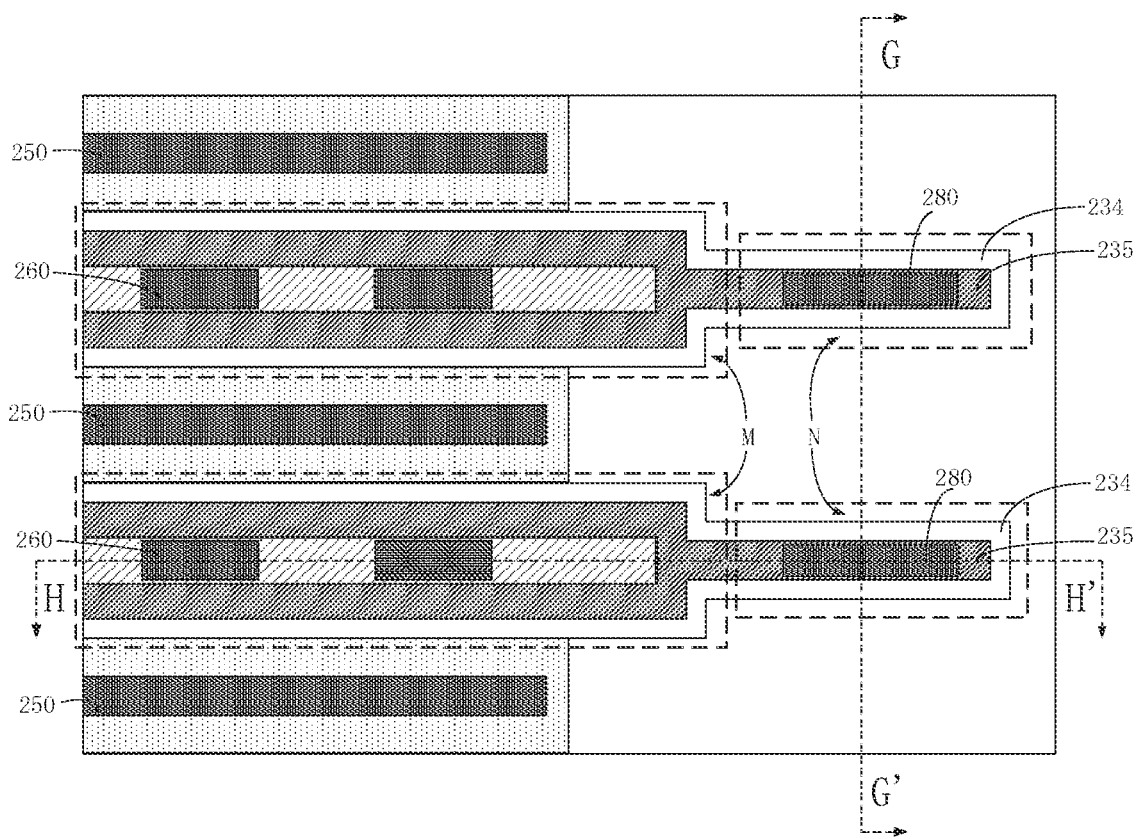
FIG. 6 is a sectional view of a semiconductor device according to another embodiment taken along C-C' section in FIG. 3.
Figure 7A:
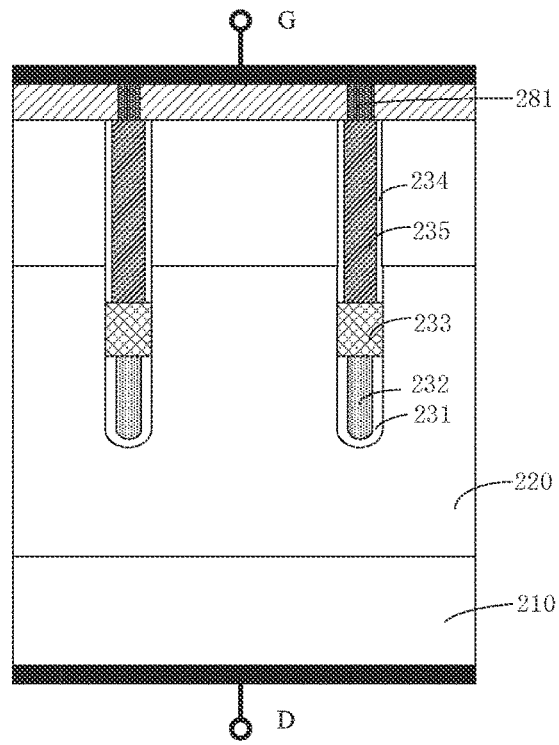
FIG. 7a is a sectional view of the semiconductor device according to an embodiment taken along G-G' section in FIG. 6.

FIG. 6 is a sectional view of a semiconductor device according to another embodiment taken along the lateral section C-C' in FIG. 3. In this embodiment, the width of the trench in the second trench region N is less than the width of the trench in the first trench region M. The second polysilicon body 235 in the second trench region N full fills the trench in the second trench region N. The gate 280 is led out from the second polysilicon body 235. After the second oxide layer 234 is formed in the trench, the second polysilicon body 235 is to be deposited in the trench. Since the trench in the first trench region M is larger in width, the second polysilicon body 235 is formed only at the side wall of the trench in the first trench region M. However, the second polysilicon body 235 does not full fill the trench in the first trench region M. In the second trench region N, since the width of the trench in the second trench region N is smaller, the trench in this region is full filled with the second polysilicon body 235. FIG. 7a is a sectional view of the semiconductor device along the section G-G' in FIG. 6. The corresponding region is the sectional view of the second trench region N. The trench above the isolation structure 233 is full filled with the second polysilicon body 235.

Figure 7B:
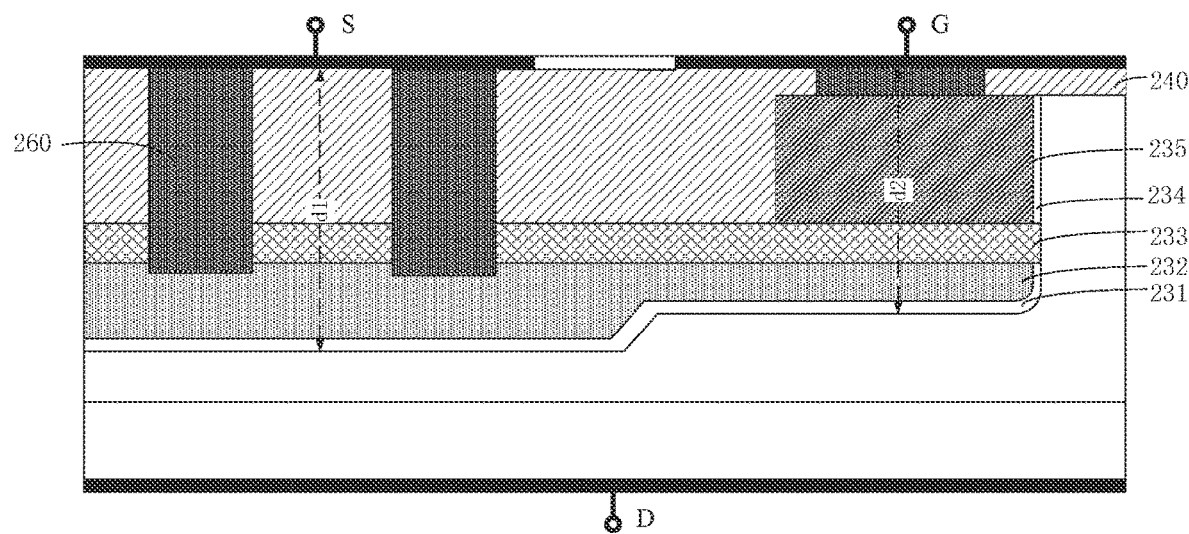
FIG. 7b is a sectional view of the semiconductor device according to an embodiment taken along section in FIG. 6.

FIG. 7b is a sectional view of the semiconductor device taken along the section H-H' in FIG. 6. A depth d2 of the trench in the second trench region is less than a depth d1 of the trench in the first trench region. Since etching depth and etching width have a certain relationship during etching the trench, the smaller the etching width is, the smaller the etching depth is. In this embodiment, since the width of the trench in the second trench region N is smaller, the depth of the trench in the second trench region N is also smaller.

Figure 8A:
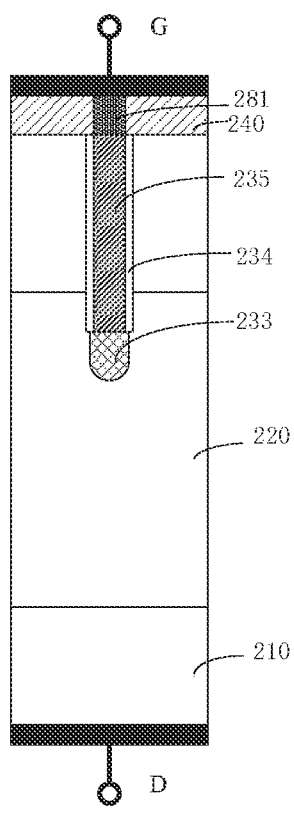
FIG. 8a shows a trench structure in a gate lead-out region according to an embodiment.

In an embodiment, the depth of the trench in the second trench region N can be adjusted according to specific situations. When the depths of the trench are different, the structures of the semiconductor device in the trench in the corresponding regions will also be different. In the present disclosure, the semiconductor devices of the first trench regions M in the trenches are substantially the same. However, the semiconductor devices of the second trench regions N can be configured differently as required. In an embodiment, as shown in FIG. 8a, when the trench in the second trench region is further reduced in depth, the trench may not include the first polysilicon body. The bottom of the trench is filled with the isolation structure 233. The second polysilicon body 235 is formed on the isolation structure 233, and the second oxide layer 234 is formed between the second polysilicon body 235 and the side wall of the trench.

Figure 8B:
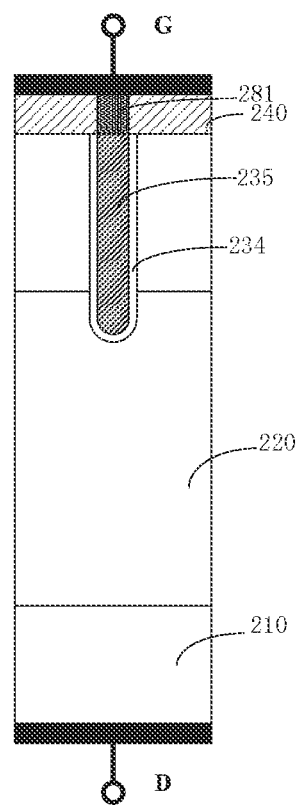
FIG. 8b shows a trench structure in a gate lead-out region according to another embodiment.

In yet another embodiment, as shown in FIG. 8b, when the depth of the trench in the second trench region N is further reduced, the trench may not include the first polysilicon body and the isolation structure. Rather, the trench is only filled with the second polysilicon body 235, and the second oxide layer 234 is formed between the second polysilicon body 235 and the side wall of the trench.

Figure 9:
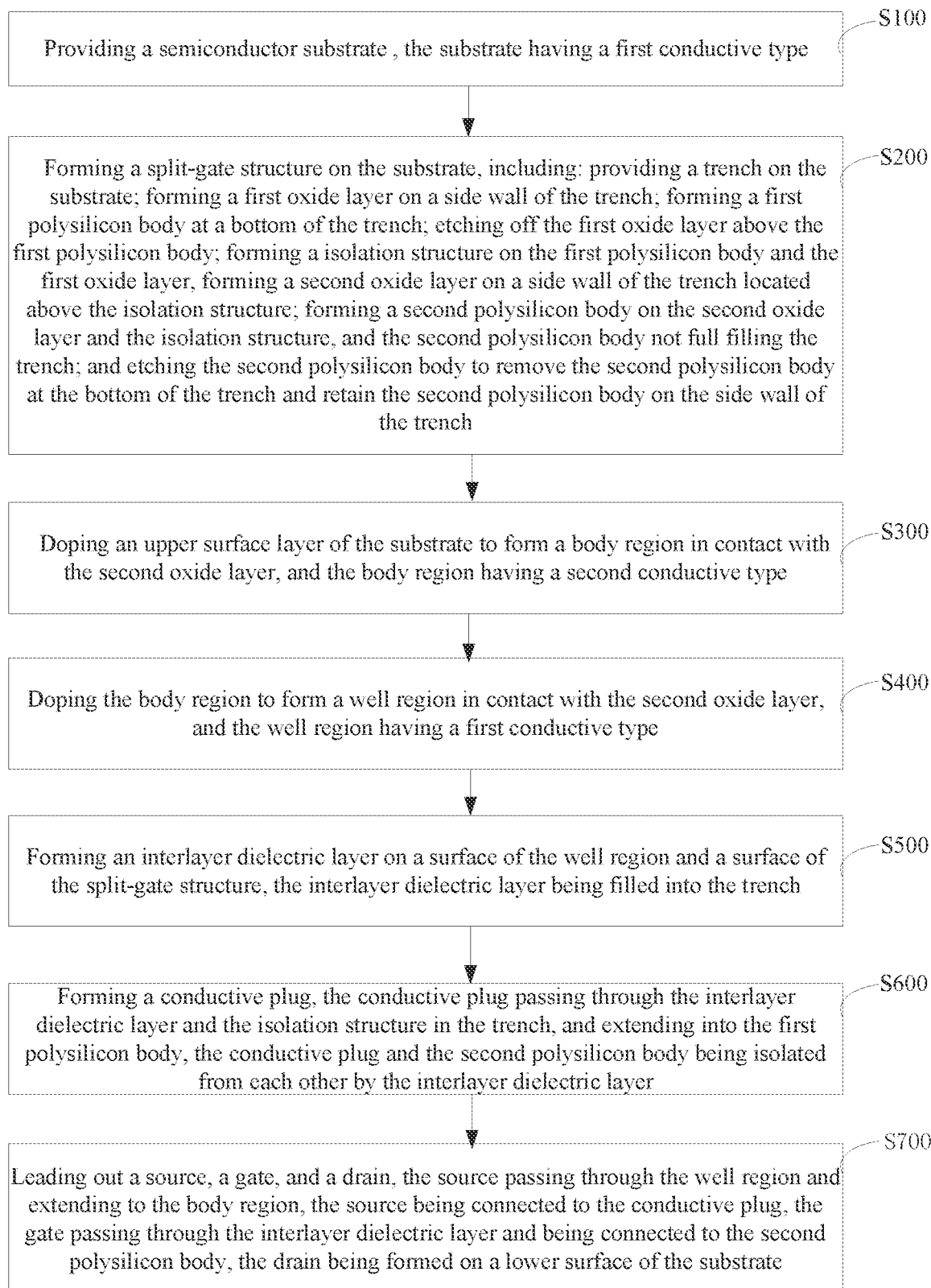
FIG. 9 is a flow chart of a method of manufacturing a semiconductor device according to an embodiment.

The present disclosure further discloses a method of manufacturing a semiconductor device. In an embodiment, as shown in FIG. 9, the manufacturing method includes following steps.

At step S100, a semiconductor substrate is provided, and the substrate has a first conductivity type.

At step S200, a split-gate structure is formed on an upper surface layer of the substrate, specifically including:

At step S210, a trench is provided on the substrate.

In an embodiment, after a patterned mask layer is formed on the semiconductor substrate 200, a deep reactive-ion etching is performed on the substrate to etch the trench on the substrate. In an embodiment, the mask layer can be a silicon nitride layer and a silicon oxide layer. In an embodiment, the semiconductor substrate 200 includes a semiconductor base 210 and an epitaxial layer 220 formed by epitaxial growth from the semiconductor base 210. The trench is specifically formed on the epitaxial layer, and the bottom end of the trench is located in the epitaxial layer 220.

At step S220, a first oxide layer is formed on a side wall of the trench.

In an embodiment, a first oxide layer 231 is formed on the side wall of the trench by a thermal oxidation process. The first oxide layer 231 is formed on the side wall of the trench, and the trench is not full filled with the first oxide layer 231.

At step S230, a first polysilicon body is formed at a bottom of the trench.

In an embodiment, the trench is first full filled with the first polysilicon body 232. Then, the first polysilicon body in the upper portion of the trench is etched off by etching-back, and the first polysilicon body 232 at the bottom of the trench is retained.

At step S240, the first oxide layer located above the first polysilicon body is etched off.

At step S250, an isolation structure is formed on the first polysilicon body and the first oxide layer.

Figure 10A:
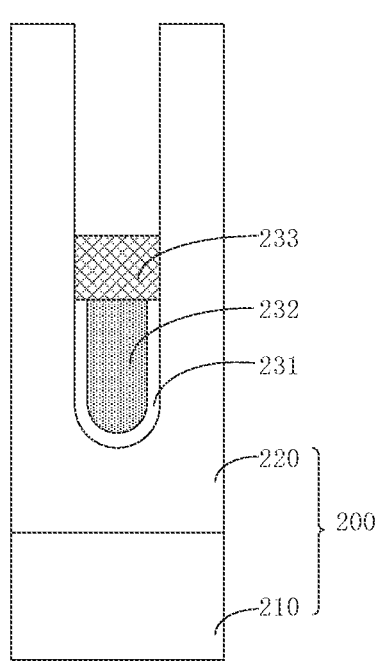
FIGS. 10a to 10f are device structure diagrams corresponding to the related steps of a method of manufacturing a semiconductor according to an embodiment.

In an embodiment, the isolation structure can be a third oxide layer. The isolation structure does not full fill the trench, and is formed by deposition. The semiconductor device having the isolation structure is shown in FIG. 10a.

At step S260, a second oxide layer is formed on a side wall of the trench above the isolation structure.

In an embodiment, a second oxide layer 234 is formed on a side wall of the trench by a thermal oxidation process. The second oxide layer 234 is formed only on the side wall of the trench, and does not full fill the trench. In an embodiment, a mask layer used for etching the trench is removed prior to step S260. Therefore, during performing the thermal oxidation in step S260, a second oxide layer will also be formed on the surface of the epitaxial layer 220, and the second oxide layer 234 will not be formed on the isolation structure 233 by the thermal oxidation process. The second oxide layer will be formed only on the side wall of the trench and on the surface of the epitaxial layer.

At step S270, a second polysilicon body is formed on the second oxide layer, and the second polysilicon body does not full fill the trench.

Figure 10B:
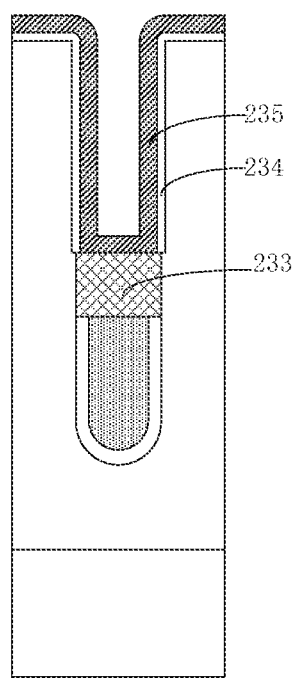

In an embodiment, a second polysilicon body 235 is formed on the second oxide layer 234 and the isolation structure 233 in the trench by a deposition process, and the second polysilicon body 235 does not full fill the trench. The second polysilicon body 235 will also be formed on the second oxide layer outside the trench. The formed semiconductor device is shown in FIG. 10b.

At step S280, the second polysilicon body is etched to remove the second polysilicon body at the bottom of the trench and retain the second polysilicon body on the side wall of the trench.

Figure 10C:
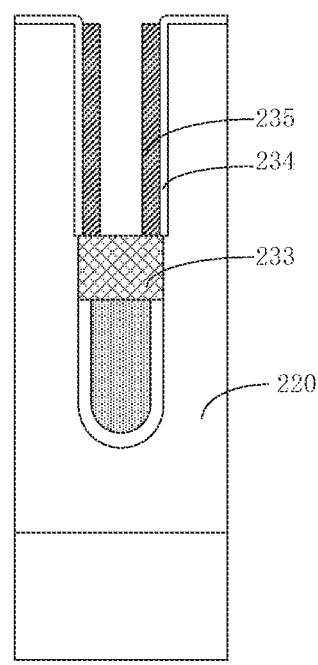

In an embodiment, by an anisotropic etching, the second polysilicon body at the bottom of the trench is etched off downwards and the second polysilicon body 235 on the side wall is retained. In an embodiment, when the second oxide layer and the second polysilicon body are formed on the surface of the epitaxial layer, the second polysilicon body on the surface of the epitaxial layer is also required to be etched off, and only the second polysilicon body on the side wall of the trench is to be retained. The structure of the formed semiconductor device is shown in FIG. 10c. At this time, the first polysilicon body 232 is isolated from the second polysilicon body 235 by the isolation structure 233 to form the split-gate structure.

At step S300, an upper surface layer of the substrate is doped to form a body region in contact with the second oxide layer, and the body region has a second conductivity type.

In an embodiment, the substrate 200 includes a base 210 and an epitaxial layer 220. The epitaxial layer 220 is doped to form a body region 221 in contact with the second oxide layer 234 on the side wall of the trench, that is, the body region 221 is located on an upper surface layer of the epitaxial layer 220. In an embodiment, when the second oxide layer 234 is retained on the upper surface of the epitaxial layer, the second oxide layer is patterned, and the epitaxial layer 220 is doped using the second oxide layer on the upper surface as a mask layer to form the body region 221.

At step S400, the body region is doped to form a well region in contact with the second oxide layer, and the well region has a first conductivity type.

In an embodiment, the body region 221 is doped to form a well region 222 in contact with the second oxide layer 234 at the side wall of the trench.

At step S500, an interlayer dielectric layer is formed on a surface of the well region and a surface of the split-gate structure, and the interlayer dielectric layer is filled into the trench.

Figure 10D:
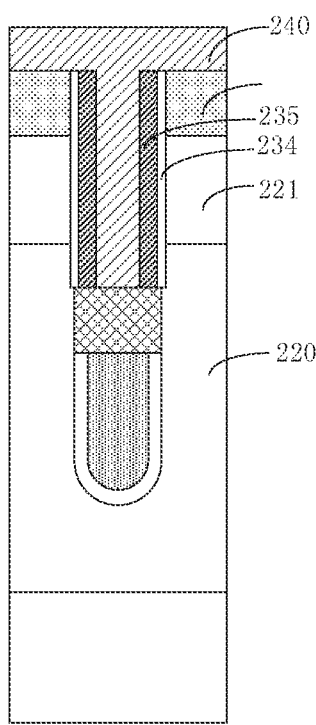

In an embodiment, an interlayer dielectric layer 240 is formed on a surface of the well region 222 and a surface of the split-gate structure, and the interlayer dielectric layer 240 is filled into the trench, that is, the interlayer dielectric layer is deposited on the surface of the semiconductor device. The structure of the formed semiconductor device is shown in FIG. 10d.

At step S600, a conductive plug is formed. The conductive plug passes through the interlayer dielectric layer and the isolation structure in the trench, and extends into the first polysilicon body. The conductive plug and the second polysilicon body are isolated from each other by the interlayer dielectric layer.

Figure 10E:
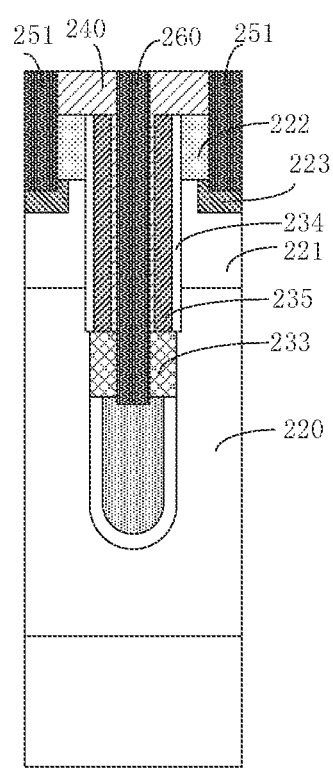

In an embodiment, a deep-trench etching is sequentially performed on the interlayer dielectric layer 240 and the isolation structure 233 in the trench, and a portion of the first polysilicon body 232 is etched, that is, a trench is formed in the split-gate structure, and a conductive material is introduced therein to form a conductive plug 260. The conductive plug 260 and the second polysilicon body 235 are isolated from each other by the interlayer dielectric layer 240. The formed semiconductor device is shown in FIG. 10e.

At step S700, a source, a gate, and a drain are led out. The source passes through the well region and extends to the body region, and the source is connected to the conductive plug. The gate passes through the interlayer dielectric layer and is connected to the second polysilicon body. The drain is formed on a lower surface of the substrate.

In an embodiment, the source includes a source lead-out structure 251 and a source metal layer 252. The gate includes a gate lead-out structure and a gate metal layer. The source lead-cut structure 251 and the gate lead-out structure can be formed at step S600. One end of the source metal lead-out structure 251 passes through the well region and is in contact with the body region 221, and the other end thereof is connected to the source metal layer 252, thereby leading out the source. Specifically, the conductive plug 260 is connected to the source metal layer 252.

Figure 10F:
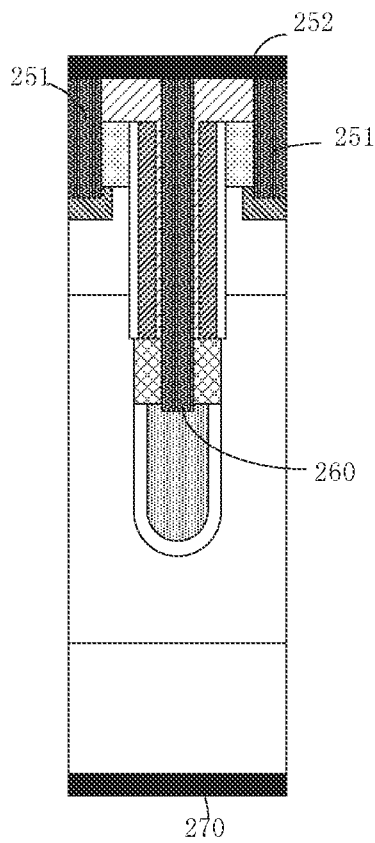

In an embodiment, at step S400, after the body region 221 is formed, the body region 221 is further doped to form a heavily doped region 223 having a higher concentration. Specifically, the source 250 is connected to the structure of the heavily doped region 223. The formed semiconductor device is shown in FIG. 10f.

FIG. 4 is a sectional view of the semiconductor device according to an embodiment taken along the lateral section C-C' in FIG. 3. The trench includes a first trench region M located at one side and a second trench region N located at the other side. The first polysilicon body 232 (not shown in FIG. 4) leads out the conductive plug 260 from the first trench region M. The second polysilicon body 235 leads out the gate 280 from the second trench region N, that is, the gate 280 and the conductive plug 260 are spaced from each other in the trench. The source 250 is led out from the body region 222 having the second conductivity type, and the source 250 is located at one side of the conductive plug 260.

Since the etching depth and the etching width have a certain relationship during etching the trench, the smaller the etching width is, the smaller the etching depth is. The depth of the trench can be adjusted by changing the width of the trench, so that the depth of the trench in the second trench region N is smaller than the depth of the trench in the first trench region M. In an embodiment, as shown in FIG. 8a, when the trench in the second trench region N is further reduced in depth, the trench may not include the first polysilicon body. The bottom of the trench is filled with the isolation structure 233. The second polysilicon body 235 is formed on the isolation structure 233, and the second oxide layer 234 is formed between the second polysilicon body 235 and the side wall of the trench. In yet another embodiment, as shown in FIG. 8b), when the depth of the trench in the second trench region N is further reduced, the trench may not include the first polysilicon body and the isolation structure. Rather, the trench is only filled with the second polysilicon body 235, and the second oxide layer 234 is formed between the second polysilicon body 235 and the side wall of the trench.

All technical features of the above-mentioned embodiments can be combined arbitrarily. In order to make the description concise, all possible combinations of the technical features in the above-mentioned embodiments are not exhaustively described. However, as long as there is no contradiction in the combination of these technical features, these combinations should be considered within the scope of this description.

The above-mentioned embodiments only express a few implementations of the present disclosure, and the description is comparably specific and detailed, but it should not be interpreted as a limitation on the scope of the present disclosure. It should be pointed out that for those of ordinary skill in the art, without departing from the concept of the present disclosure, several modifications and improvements can be made, and these all fall within the protection scope of the present disclosure. Therefore, the protection scope of the disclosure should be subject to the appended claims.

What is claimed is:

1. A semiconductor device, comprising:
   a semiconductor substrate having a first conductivity type;
   a body region having a second conductivity type and formed on an upper surface layer of the substrate;
   a well region having the first conductivity type and formed on a surface layer of the body region;
   a split-gate structure provided within a trench passing through the well region and the body region and extending to the substrate, wherein the trench comprises a first trench region located at one end of the trench and a second trench region located at the other end of the trench, a depth of the trench in the second trench region is less than a depth of the trench in the first trench region, the split-gate structure comprising:
      a first polysilicon body formed at a bottom of the first trench region and a bottom of the second trench region, and a first oxide layer being formed between the first polysilicon body, and a bottom wall and a side wall of the trench;
      an isolation structure formed above the first polysilicon body; and
      a second polysilicon body formed on a top side wall of the first trench region and a top of the second trench region, and a second oxide layer being formed between the second polysilicon body and the side wall of the trench, the first polysilicon body and the second polysilicon body are isolated by the isolation structure;
   an interlayer dielectric layer formed on a surface of the well region and a surface of the split-gate structure, the interlayer dielectric layer further passing through the second polysilicon body in the first trench region and extending to the isolation structure, such that in the first trench region, the second polysilicon body is located between the interlayer dielectric layer and the second oxide layer; and in the second trench region, the second polysilicon body fully fills the trench above the isolation structure except the second oxide layer;
   a source passing through the interlayer dielectric layer and the well region and extending to the body region;
   a conductive plug, one end of the conductive plug passing through the interlayer dielectric layer and the isolation structure in the first trench region and extending into the first polysilicon body in the first trench region, the other end of the conductive plug being connected to the source, the second polysilicon body in the first trench region and the conductive plug being isolated from each other by the interlayer dielectric layer;
   a gate connected to the second polysilicon body in the second trench region; and
   a drain formed on a lower surface of the substrate.

2. The semiconductor device of claim 1, wherein at least a portion of the second polysilicon body is located directly above the first polysilicon body to cover a portion of a top surface of the first polysilicon body.

3. The semiconductor device of claim 1, wherein a heavily doped region is formed in the body region, a doping concentration of the heavily doped region is higher than a doping concentration of the body region, and the source extends into the heavily doped region.

4. The semiconductor device of claim 1, wherein the body region leads out the source, and the source is located at one side of the conductive plug.

5. The semiconductor device of claim 4, wherein the source comprises a source lead-out structure and a source metal layer, the source lead-out structure and the conductive plug are located at the same side of the trench, one end of the source lead-out structure extends into the body region, and the other end thereof is connected to the source metal layer.

6. The semiconductor device of claim 1, wherein the second polysilicon body in the second trench region is formed on the side wall of the trench and does not fully fill the trench in the second trench region, the interlayer dielectric layer is filled in the trench, the second polysilicon bodies located at two sides of the interlayer dielectric layer in the second trench region lead out the gate.

7. The semiconductor device of claim 1, wherein the second trench region does not comprise the first polysilicon body, the second trench region comprises the isolation structure located at the bottom of the trench and the second polysilicon body formed on the isolation structure, and the second oxide layer is formed between the second polysilicon body and the side wall of the trench.

8. The semiconductor device of claim 1, wherein the second trench region does not comprise the first polysilicon body and the isolation structure, the second trench region is filled with the second polysilicon body, the second oxide layer is formed between the second polysilicon body and the side wall of the trench.

9. The semiconductor device of claim 1, wherein the isolation structure, the first oxide layer, the second oxide layer, and the interlayer dielectric layer are silicon oxide.

10. A method of manufacturing a semiconductor device, comprising:
    providing a semiconductor substrate, and the substrate having a first conductivity type;
    forming a split-gate structure on the substrate, comprising:
       providing a trench on the substrate, wherein the trench comprises a first trench region and a second trench region, a depth of the trench in the second trench region is less than a depth of the trench in the first trench region;
       forming a first oxide layer on a side wall of the trench;
       forming a first polysilicon body at a bottom of the trench;
       etching off the first oxide layer located above the first polysilicon body;
       forming an isolation structure on the first polysilicon body and the first oxide layer;
       forming a second oxide layer on a side wall of the trench located above the isolation structure;
       forming a second polysilicon body on the second oxide layer and the isolation structure, the second polysilicon body not fully filling the first trench region and fully filling the second trench region; and
       etching the second polysilicon body to remove the second polysilicon body at the bottom of the first trench region and retain the second polysilicon body on the side wall of the first trench region;
    doping an upper surface layer of the substrate to form a body region in contact with the second oxide layer, and the body region having a second conductivity type;

doping the body region to form a well region in contact with the second oxide layer, the well region having the first conductivity type;

forming an interlayer dielectric layer on a surface of the well region and a surface of the split-gate structure, the interlayer dielectric layer being filled into the first trench region, such that in the first trench region, the interlayer dielectric layer passes through the second polysilicon body in the first trench region and extends to the isolation structure, and the second polysilicon body is located between the interlayer dielectric layer and the second oxide layer;

forming a conductive plug, the conductive plug passing through the interlayer dielectric layer and the isolation structure in the first trench region, and extending into the first polysilicon body, the conductive plug and the second polysilicon body being isolated from each other by the interlayer dielectric layer; and leading out a source, a gate, and a drain, the source passing through the well region and extending to the body region, the source being connected to the conductive plug, the gate passing through the interlayer dielectric layer and being connected to the second polysilicon body, the drain being formed on a lower surface of the substrate.

11. The method of manufacturing the semiconductor device of claim 10, wherein the body region having the second conductivity type leads out the source and the source is located at one side of the conductive plug.

\* \* \* \* \*